United States Patent
Kim et al.

(10) Patent No.: US 9,184,203 B2
(45) Date of Patent: Nov. 10, 2015

(54) IMAGE SENSOR AND METHOD FOR FABRICATING THE SAME

(71) Applicant: SK hynix Inc., Gyeonggi-do (KR)

(72) Inventors: Do-Hwan Kim, Gyeonggo-do (KR);
Dong-Hyun Woo, Gyeonggi-do (KR);
Jong-Chae Kim, Gyeonggi-do (KR);
Chung-Seok Choi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/292,401

(22) Filed: May 30, 2014

(65) Prior Publication Data
US 2015/0130003 A1    May 14, 2015

(30) Foreign Application Priority Data
Nov. 13, 2013  (KR) .................. 10-2013-0137656

(51) Int. Cl.
*H01L 27/146* (2006.01)
*H01L 21/00* (2006.01)

(52) U.S. Cl.
CPC ...... *H01L 27/14638* (2013.01); *H01L 27/1464* (2013.01); *H01L 27/14601* (2013.01); *H01L 27/14621* (2013.01); *H01L 27/14627* (2013.01); *H01L 27/14685* (2013.01)

(58) Field of Classification Search
CPC ................... H01L 27/14604; H01L 27/14638; H01L 27/14647; H01L 31/18; H01L 31/1884; H01L 43/08; H01L 43/12; H01L 27/1464; H01L 27/14601; H01L 27/14627; H01L 27/14621; H01L 27/14685; F01L 31/02162
See application file for complete search history.

(56) References Cited

U.S. PATENT DOCUMENTS

| | | | |
|---|---|---|---|
| 7,109,409 B2* | 9/2006 | Chu | 136/254 |
| 8,124,440 B2* | 2/2012 | Ikuta et al. | 438/79 |
| 2006/0096633 A1* | 5/2006 | Chu | 136/254 |
| 2010/0059843 A1* | 3/2010 | Ikuta et al. | 257/432 |
| 2011/0310282 A1 | 12/2011 | Toda et al. | |

FOREIGN PATENT DOCUMENTS

KR    1020110064097    6/2011

OTHER PUBLICATIONS

Hou, Te-Chien, et al., Room-temperature ferromagnetism in CrSi2(core)/SiO2 (shell) semiconducting nanocables, Appl. Phys. Lett., 2011, 193104, vol. 98.
Nakamura, Toshihiro, et al., Ferromagnetism in sputtered manganese-doped indium tin oxide films with high conductivity and transparency, Journal of Applied Physics, 2007, 09H105, vol. 101.
Galkin, N. G., et al., Optical and photospectral properties of CrSi2 A-type epitaxial films on Si(111), Thin Solid Films, 1997, pp. 230-238, voi.311.
Matsumoto, Yuji, et al., Room-Temperature Ferromagnetism in Transparent Transition Metal-Doped Titanium Dioxide, Science, 2001, pp. 854-856, vol. 291.
Liewrian, Watchara, et al., Spin switching effects in a ferromagnetic graphene junction having a second gate, Physica E, 2009.

* cited by examiner

*Primary Examiner* — Nikolay Yushin
(74) *Attorney, Agent, or Firm* — IP & T Group LLP

(57) ABSTRACT

An image sensor includes a substrate including photoelectric conversion regions, a magnetic layer disposed on a back side of the substrate and suitable for generating a magnetic field, and color filters and microlenses disposed on the magnetic layer.

15 Claims, 3 Drawing Sheets

IMAGE SENSOR AND METHOD FOR FABRICATING THE SAME

CROSS-REFERENCE TO RELATED APPLICATIONS

The present application claims priority of Korean Patent Application No. 10-2013-0137656 on Nov. 13, 2013, which is incorporated herein by reference in its entirety.

BACKGROUND

1. Field

Exemplary embodiments of the present invention relate to an image sensor, and more particularly, to a back side illumination image sensor and a method for fabricating the back side same.

2. Description of the Related Art

An image sensor transforms an optical image into electric signals. Generally, image sensors are categorized into a Charge Coupled Device (CCD) image sensor and a CMOS image sensor (CIS). An image sensor includes a plurality of pixels, and each of the pixels outputs a pixel signal corresponding to incident light. Herein, each of the pixels accumulates photocharges corresponding to incident light in a photoelectric converting device, which is represented by a photodiode, and outputs a pixel signal based on the accumulated photocharges.

Image sensors have a concern in that dark current may deteriorate characteristics of the image sensors. Usually the dark current is caused due to the charges generated on a back side of a substrate where the photoelectric converting device is formed. The dark current works as noise to pixel signals to deteriorate the characteristics of the image sensors

SUMMARY

Various embodiments of the present invention are directed to an image sensor capable of preventing deterioration of its characteristics due to dark current, and a method for fabricating the image sensor.

In accordance with an embodiment of the present invention, an image sensor may include a substrate including photoelectric conversion regions, a magnetic layer disposed on a back side of the substrate and suitable for generating a magnetic field, and color filters and microlenses disposed on the magnetic layer.

The magnetic layer may generate the magnetic field in a direction horizontal to the back side of the substrate by applying an electric field in a direction perpendicular to the substrate. The magnetic layer may include a ferromagnetic substance. The magnetic layer may include titanium dioxide ($TiO_2$) or indium-tin oxide (ITO).

The image sensor may further include an impurity barrier region disposed between the photoelectric conversion regions. The impurity barrier region may be disposed within a back side portion of the substrate.

In accordance with another embodiment of the present invention, a method for fabricating an image sensor may include forming photoelectric conversion regions in a substrate, forming an dielectric layer on a front side of the substrate, forming a magnetic layer on a back side of the substrate, and forming color filters and microlenses on the magnetic layer.

DETAILED DESCRIPTION

Figure 1:
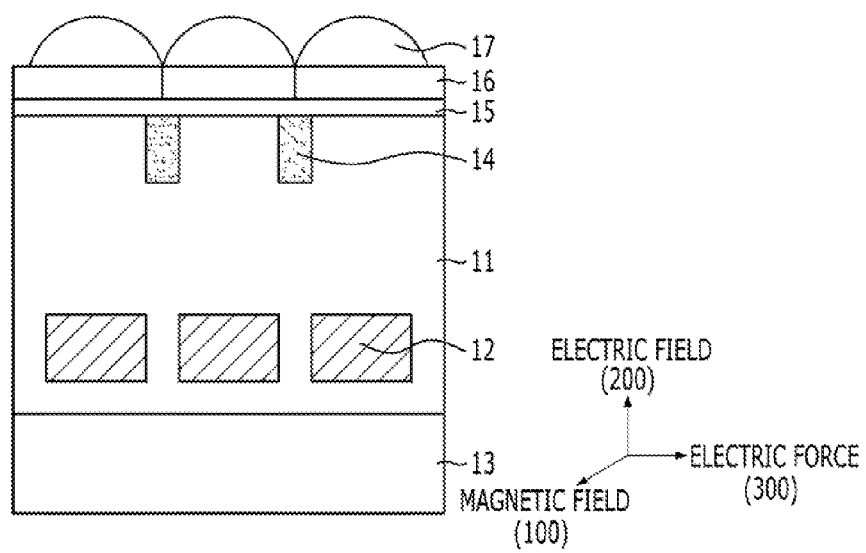
FIG. 1 is a cross-sectional view illustrating an image sensor in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Also, when a multi-layer structure including two or more layers is described in the drawings or the detailed description section of the specification, the description does not limit the spirit and concept of the present invention but it shows the relative positions and/or disposition order of the Layers. The relative positions and/or disposition order of the layers may be different according to an exemplary embodiment of the present invention. Also, the drawings or the detailed description section of the specification may not describe all the layers existing in a particular multi-layer structure. For example, there may be one or more additional layers between two layers, which are shown in the drawings or the detailed description section of the specification.

FIG. 1 is a cross-sectional view illustrating an image sensor in accordance with an embodiment of the present invention.

Referring to FIG. 1, an isolation layer (not shown) for isolating a photoelectric conversion region 12 from neighboring pixels is formed in a substrate 11 including a plurality of pixels, and a dielectric layer 13 including a signal generation circuit (not shown) is formed over the substrate 11. An impurity barrier region 14 is then formed on the back side of the substrate 11, and a magnetic layer 15 generating a magnetic field is formed on the back side of the substrate 11 in a direction horizontal to the back side of the substrate 11. Color filters 16 and microlenses 17 are formed over the magnetic layer 15.

The substrate 11 may include a semiconductor substrate. The semiconductor substrate may be of a monocrystalline semiconductor, and it may include a silicon-containing material. In other words, the substrate 11 may include a monocrystalline silicon-containing material. For example, the substrate 11 may be a bulk silicon substrate or a Silicon-On-Insulator (SOI) substrate including a silicon epitaxial layer.

The photoelectric conversion region 12 may include a plurality of photoelectric converters (not shown) that are stacked vertically. Each of the photoelectric converters (not shown) may be a photo diode including an N-type impurity region and a P-type impurity region. The photoelectric conversion region 12 may be formed in the substrate 11 to be contact with a back side of the substrate 11 and may penetrate through the substrate 11. The photoelectric conversion region 12 may penetrate through the substrate 11 in contact with both front side and back side of the substrate 11. Also, the photoelectric conversion region 12 may contact the front side of the substrate 11 while being spaced apart from the back side of the substrate 11 by a predetermined distance.

The dielectric layer 13 may include at least one material selected from the group including an oxide, a nitride, and an oxynitride. The signal generation circuit (not shown) formed in the inside of the dielectric layer 13 may include a plurality of transistors (not shown), multiple layers of metal lines (not shown), and contact plugs (not shown) that connect them with each other. The signal generation circuit (not shown) generates (or outputs) pixel signals (or electric signals) corresponding to the photocharges that are generated in the photoelectric conversion region 12.

The impurity barrier region 14 may be formed in the substrate 11 to be contact with a back side of the substrate 11 and may be disposed between the photoelectric conversion regions 12 to function as a barrier for controlling the transfer of charges. The impurity barrier region 14 may include a P-type impurity. For example, the P-type impurity may include boron (B).

The magnetic layer 15 may have a magnetic field that is formed in a horizontal direction to the back side of the substrate 11. The magnetic layer 15 may include a ferromagnetic substance. For example, the magnetic layer 15 may include titanium dioxide ($TiO_2$) or indium-tin oxide (ITO). The magnetic layer 15 may include a ferromagnetic substance of a nanoparticles type, or it may be a layer formed in a thickness that visible light may penetrate through, e.g approximately 25 nm or less.

The magnetic layer 15 generating the magnetic field 100 in a direction horizontal to the back side of the substrate 11 may prevent the generation of dark current and noise by applying an electric force 300 in a direction substantially perpendicular to the magnetic field 100 while still being horizontal to the back side of the substrate 11, which is toward the impurity barrier region 14, and controlling the charges that generate the dark current or the charges that work as noise. Also, the magnetic layer 15 generating the magnetic field 100 may improve lag effect as charges are induced to transfer when a transistor is turned on due to the magnetic field 100 of the magnetic layer 15. The magnetic layer 15 generating the magnetic field 100 may be formed in contact with the back side of the substrate 11 and it may vertically overlap with the photoelectric conversion region 12.

According to another embodiment of the present invention the direction of the magnetic field 100 of the magnetic layer 15 may be controlled by forming a transparent electrode between the magnetic layer 15 and the back side of the substrate 11.

The color filters 16 may be formed corresponding to the photoelectric conversion regions 12. For example, red (R), green (G) and blue (B) filters may be formed corresponding to the photoelectric conversion regions 12 of red (R), green (G) and blue (B) pixels, or when the image sensor includes an infrared photoelectric conversion region, an infrared filter corresponding to an infrared ray receiving device may be formed.

The microlenses 17 may be provided to make incident light entering from the back side of the substrate 11 focus into the photoelectric conversion regions 12 of the corresponding pixels. The color filters 16, e.g., the red (R), green (G) and blue (B) filters, or the infrared filter, select necessary light out of the light entering through the microlenses 17, and the selected light may enter the photoelectric conversion region 12 of the corresponding pixels.

According to the embodiment of the present invention, it may be possible to control the charges that may work as dark current or noise, such as crosstalk, by forming the magnetic layer 15 generating a magnetic field and applying the electric force 300 toward the impurity barrier region 14.

FIGS. 2A to 2D are cross-sectional views illustrating a method for fabricating an image sensor in accordance with an embodiment of the present invention. FIGS. 2A to 2D describe a method for fabricating the image sensor of FIG. 1. To help understanding, the same reference numerals appearing in FIG. 1 are used herein.

Figure 2A:
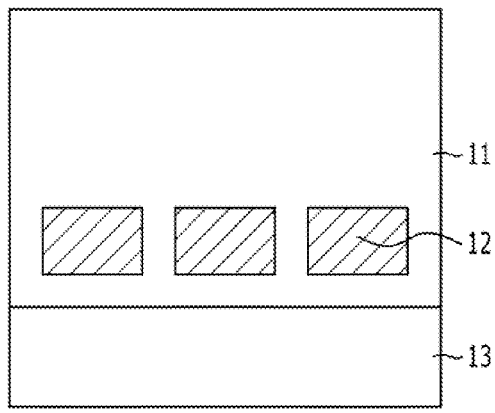
FIGS. 2A to 2O are cross-sectional views illustrating a method for fabricating an image sensor in accordance with an embodiment of the present invention.
Figure 2B:
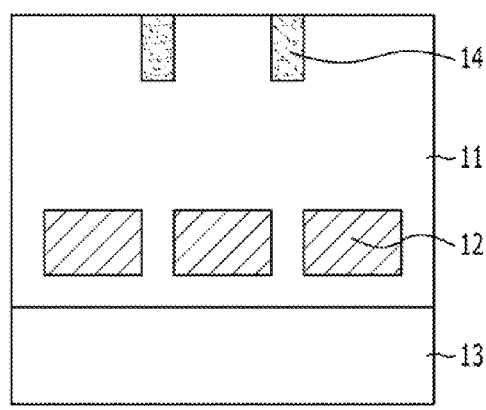

Referring to FIG. 2A, a substrate 11 where a plurality of pixels are defined is prepared. The substrate 11 may be a semiconductor substrate. The semiconductor substrate may be of a monocrystalline semiconductor, and it may include a silicon-containing material. In other words, the substrate 11 may include a monocrystalline silicon-containing material. For example, the substrate 11 may be a bulk silicon substrate or a Silicon-On-Insulator (SOI) substrate including a silicon epitaxial layer.

Subsequently, isolation regions (not shown) are formed in the substrate 11 along the boundary where the pixels contact each other. The isolation regions (not shown) may be formed by forming isolation trenches in the substrate 11 and gap-filling the isolation trenches with a dielectric material through a Shallow Trench Isolation (STI) process.

Subsequently, photoelectric conversion regions 12 are formed in the substrate 11. The photoelectric conversion regions 12 may include a plurality of photoelectric converters (not shown) that are stacked vertically. Each of the photoelectric converters (not shown) may be a photo diode including an N-type impurity region and a P-type impurity region. The photo diode may be formed through an impurity ion implantation process.

Subsequently, an dielectric layer 13 including a signal generation circuit (not shown) is formed over the substrate 11. The dielectric layer 13 may include at least one material selected from the group consisting of an oxide, a nitride, and an oxynitride. The dielectric layer 13 may have a stacked structure. The signal generation circuit (not shown) generates (or outputs) electric signals corresponding to the photocharges that are generated in the photoelectric conversion regions 12. The signal generation circuit (not shown) formed in the inside of the dielectric layer 13 may include a plurality of transistors (not shown multiple layers of metal lines (not shown), and contact plugs (not shown) that connect them with each other. The transistors may include a transfer transistor Tx, a selection transistor Sx, a reset transistor Rx, and an access transistor Ax.

Referring to FIG. 26, a thinning process is performed on the back side of the substrate 11 to reduce the thickness of the substrate 11. The thinning process is performed to shorten the range of incident light entering the photoelectric conversion regions 12 to increase light reception efficiency. The thinning process may be performed through a backgrinding or a polishing process.

Subsequently, an impurity barrier region 14 formed on the back side of the substrate 11. The impurity barrier region 14 may be formed by forming a mask pattern on the back side of the substrate 11 and doping it with a P-type impurity. For example, the P-type impurity may include boron (B). The impurity barrier region 14 may be disposed between the photoelectric conversion regions 12 to function as a barrier for controlling the transfer of charges into neighboring pixels when the image sensor operates.

Figure 2C:
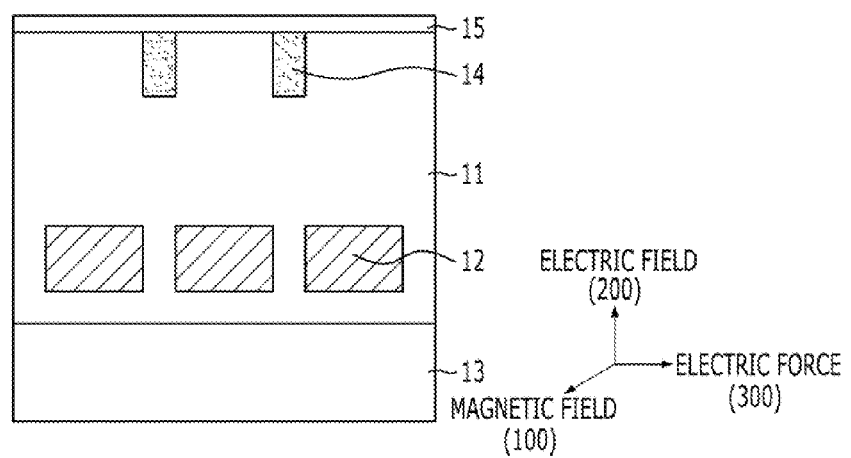

Referring to FIG. 2C a magnetic layer 15 having a magnetic field 100 is formed in a horizontal direction to the back side of the substrate 11. The magnetic layer 15 may include a ferromagnetic substance. For example, the magnetic layer 15 may include titanium dioxide or indium-tin oxide. The magnetic layer 15 may include a ferromagnetic substance of a nanoparticles type. The size of the nanoparticles may be approximately 5 nm or less, and the deviation of the size of the nanoparticles may be controlled to be approximately 10% or less. The magnetic layer 15 may be formed as a layer having a thickness that visible light may penetrate through, e.g., approximately 25 nm or less. In the drawing, a reference numeral '100' denotes the direction of the magnetic field, and a reference numeral '200' denotes the direction of an electric field, while a reference numeral '300' denotes the direction of an electric force.

The magnetic layer 15 may be formed to generate the magnetic field 100 in the direction horizontal to the back side of the substrate 11. For example, the magnetic layer 15 generating the magnetic field 100 in the direction horizontal to the back side of the substrate 11 may be formed by putting the substrate 11 including the magnetic layer 15 in an equipment where the electric field 200 is formed and flow in a cylindrical shape, that is, in the horizontal direction to the back side of the substrate 11. Also, the magnetic layer 15 generating the magnetic field 100 in the horizontal direction to the back side of the substrate 11 may improve lag failure and prevent the generation of dark current and noise by applying the electric force 300 in a direction substantially perpendicular to the magnetic field 100, which is toward the impurity barrier region 14, while having the direction horizontal to the back side of the substrate 11 just as the magnetic field 100 based on the Fleming's left hand rule to control the charges that generate the dark current or the charges that work as noise. The magnetic layer 15 generating the magnetic field 100 may be formed in contact with the back side of the substrate 11 and it may vertically overlap the photoelectric conversion region 12.

When light enters from the outside and thus charges are generated in the photoelectric conversion region 12, the charges for generating the dark current that are formed on the back side of the photoelectric conversion region 12 move toward the impurity barrier region 14 based on the electric force 300 to prevent the generation of dark current and noise. Charges in the other regions may be controlled by a floating diffusion region (FD) barrier since the transfer transistor Tx is turned off. For the same reason, when the transfer transistor Tx is turned on, the charges easily move to the floating diffusion region (FD) due to the electric force 300 to improve the lag failure.

According to another embodiment of the present invention, a transparent electrode may be formed between the magnetic layer 15 and the back side of the substrate 11 to control the direction of the magnetic field 100.

According to the embodiment of the present invention, the charges capable of working as dark current or noise such as crosstalk may be controlled by applying the electric force 300 toward the impurity barrier region 14 by forming the magnetic layer 15 generating a magnetic field.

Figure 2D:
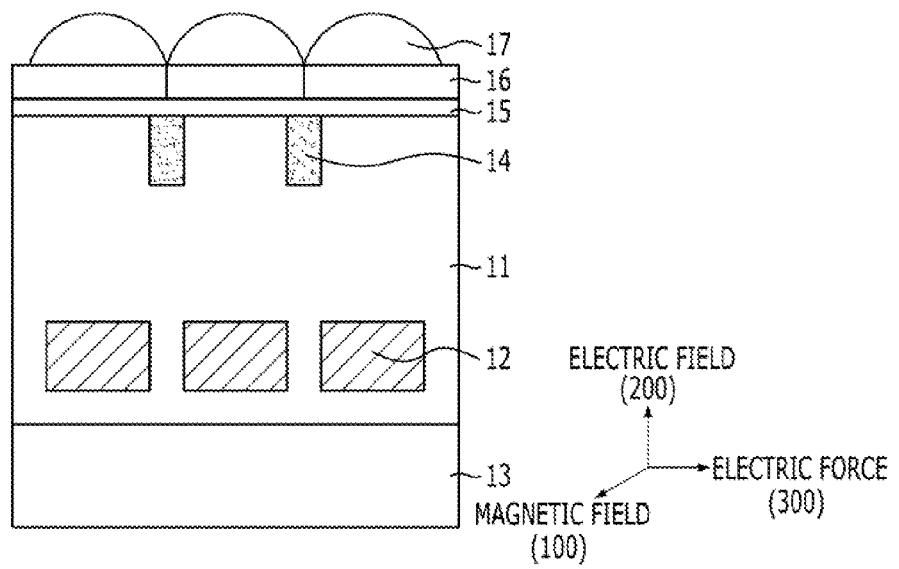

Referring to FIG. 2D, the color filters 16 and the microlenses 17 are formed over the magnetic layer 15.

Corresponding color filters 16 may be formed according to the photoelectric conversion region 12. For example, red (R), green (G) and blue (B) filters are formed corresponding to the photoelectric conversion regions 12 of red (R), green (G) and blue (B) pixels. If the image sensor includes an infrared photoelectric conversion region 12, an infrared filter may be formed corresponding to an infrared light receiving device.

The microlenses 17 may be formed in plural to make incident light entering from the back side of the substrate 11 focus into the photoelectric conversion regions 12 of the corresponding pixels. The color filters 16, e.g., the red (R), green (G) and blue (B) filters, or the infrared filter, select necessary light out of the light entering through the microlenses 17, and the selected light may enter the photoelectric conversion region 12 of the corresponding pixels.

Subsequently, the fabrication of the image sensor may be completed through the known fabrication technology.

According to an embodiment of the present invention, charges may be controlled by forming a magnetic layer generating a magnetic field in a horizontal direction to the back side of a substrate and applying an electric force in a direction substantially perpendicular to the substrate. As a result, the generation of dark current and an increase in crosstalk may be prevented, thus protecting the characteristics of an image sensor from being deteriorated.

While the present invention has been described with respect to the specific embodiments, it will be apparent to those skilled in the art that various changes and modifications may be made without departing from the spirit and scope of the invention as defined in the following claims.

What is claimed is:

1. An image sensor, comprising:
   a substrate including photoelectric conversion regions;
   a magnetic layer disposed on a back side of the substrate and suitable for generating a magnetic field;
   impurity barrier region disposed within a back side portion of the substrate and contacted to the magnetic layer; and
   color filters and microlenses disposed on the magnetic layer.

2. The image sensor of claim 1, wherein the magnetic field is oriented in a direction horizontal to the back side of the substrate.

3. The image sensor of claim 1, wherein the magnetic layer includes a ferromagnetic substance.

4. The image sensor of claim 1, wherein the magnetic layer includes titanium dioxide or indium-tin oxide.

5. The image sensor of claim 1, further comprising:
   an impurity barrier region disposed between each of the photoelectric conversion regions.

6. The image sensor of claim 1, wherein the impurity barrier region includes a P-type impurity.

7. The image sensor of claim 1, further comprising:
   isolation regions formed in the substrate along a boundary where pixels contact each other.

8. The image sensor of claim 1, wherein the magnetic layer and the photoelectric conversion regions are not overlapped each other.

9. A method for fabricating an image sensor, comprising:
   forming photoelectric conversion regions in a substrate;
   forming an dielectric layer on a front side of the substrate;
   forming an impurity barrier region within a back side portion of the substrate
   forming a magnetic layer on a back side of the substrate for generating a magnetic field; and
   forming color filters and microlenses on the magnetic layer,
   wherein the impurity barrier region disposed within a back side portion of the substrate and contacted to the magnetic layer.

10. The method of claim 9, wherein the impurity barrier region includes a P-type impurity.

11. The method of claim 9, wherein the magnetic layer includes a ferromagnetic substance.

12. The method of claim 9, wherein the magnetic layer includes titanium dioxide or indium-tin oxide.

13. The method of claim 9,
wherein the impurity barrier region is formed before the forming of the magnetic layer.

14. The method of claim 9, further comprising:
isolation regions formed in the substrate along a boundary where pixels contact each other.

15. The method of claim 9, wherein the magnetic layer and the photoelectric conversion regions are not overlapped with each other.

* * * * *